United States Patent
Nakagomi et al.

(10) Patent No.: US 10,504,743 B2
(45) Date of Patent: Dec. 10, 2019

(54) METHOD OF ETCHING FILM

(71) Applicant: TOKYO ELECTRON LIMITED, Tokyo (JP)

(72) Inventors: Motoko Nakagomi, Nirasaki (JP); Kohichi Satoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/000,951

(22) Filed: Jun. 6, 2018

(65) Prior Publication Data
US 2018/0366337 A1  Dec. 20, 2018

(30) Foreign Application Priority Data

Jun. 14, 2017  (JP) .................................. 2017-116932

(51) Int. Cl.
*H01L 21/311* (2006.01)
*H01L 21/67* (2006.01)
(Continued)

(52) U.S. Cl.
CPC .... *H01L 21/31116* (2013.01); *H01L 21/3065* (2013.01); *H01L 21/32135* (2013.01); *H01L 21/67069* (2013.01); *H01L 21/67253* (2013.01)

(58) Field of Classification Search
CPC ......... H01L 21/31116; H01L 21/67253; H01L 21/67069
See application file for complete search history.

(56) References Cited

U.S. PATENT DOCUMENTS

| 5,948,958 A * | 9/1999 | Bang ................. H01L 21/67253 73/1.36 |
| 2016/0079081 A1* | 3/2016 | Toda ................. H01L 21/31116 216/79 |
| 2017/0282221 A1* | 10/2017 | Lee ........................... B08B 3/12 |

FOREIGN PATENT DOCUMENTS

| JP | 2009-49284 A | 3/2009 |
| JP | 2014-13841 A | 1/2014 |

OTHER PUBLICATIONS

Internet publication "Pressure and your Mass Flow Controller" obtained from site (http://mfchelp.com/mass-flow-controller-tutorial/pressure-and-your-mass-flow-controller) dated back to as early as Dec. 19, 2012 (Year: 2012).*

(Continued)

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

A method of etching a film of a workpiece, which includes: measuring a second flow rate of a first gas based on an increase rate of an internal pressure of a first chamber in a state in which a valve is closed and the first gas is supplied into the first chamber at a first flow rate adjusted by a flow rate controller, and calibrating the flow rate controller using the measured second flow rate; supplying a second gas into the first chamber; exhausting the first chamber; supplying a mixed gas of the first and second gases into the first chamber with the workpiece not mounted on a stage; forming a reaction product from the film by supplying the mixed gas into the first chamber with the workpiece mounted on the stage; and removing the reaction product by heating the workpiece with the workpiece accommodated in a second chamber.

7 Claims, 6 Drawing Sheets

(51) Int. Cl.
*H01L 21/3065* (2006.01)
*H01L 21/3213* (2006.01)

(56) References Cited

OTHER PUBLICATIONS

WayBackMachine internet archive dating of "Pressure and your Mass Flow Controller" (Year: 2012).*

* cited by examiner

METHOD OF ETCHING FILM

CROSS-REFERENCE TO RELATED APPLICATION

This application is based upon and claims the benefit of priority from Japanese Patent Application No. 2017-116932, filed on Jun. 14, 2017, the entire contents of which are incorporated herein by reference.

TECHNICAL FIELD

The present disclosure relates to a method of etching a film.

BACKGROUND

In the fabrication of electronic devices, a film etching is performed in order to process a film of a workpiece or to remove unnecessary film. For example, etching a silicon oxide film is performed. As a method of etching the silicon oxide film, a chemical oxide removal (COR) process has been used.

In the COR process, a workpiece having a silicon oxide film is disposed inside a first chamber. Then, an HF gas and an $NH_3$ gas are supplied into the first chamber. The HF gas and the $NH_3$ gas thus supplied react with the silicon oxide film to form a reaction product. Subsequently, the workpiece having the reaction product formed thereon is heated inside a second chamber. As the workpiece is heated, the reaction product is sublimated and exhausted. As a result, the silicon oxide film is etched In general, a flow rate of a gas supplied into a chamber is controlled to become a set flow rate by a flow rate controller. As in the above-described COR process, even in etching for subliming and removing a reaction product produced from a film by using two or more kinds of gases, the flow rate of the gas supplied into the chamber is controlled to become a set flow rate by the flow rate controller. In such etching, the accuracy of the flow rate control performed by the flow rate controller involves the result of etching of a film of a workpiece. Therefore, the flow rate controller is calibrated such that the gas is supplied into the chamber at the set flow rate.

As a method of calibrating the flow rate controller, a build-up method is known. In such a build-up method, an increase rate of an internal pressure of a chamber is obtained in a state in which a gas, whose flow rate is adjusted by a flow rate controller, is supplied into the chamber. Based on the obtained increase rate, a current flow rate of the gas supplied into the chamber is measured. The flow rate controller is calibrated using the measured current flow rate.

When calibrating the flow rate controller which controls the flow rate of a first gas out of the above-mentioned two or more kinds of gases, particles (for example, molecules) constituting the first gas adhere onto a wall surface defining a chamber and the surface of a stage inside the chamber. When the etching using the above-mentioned two or more kinds of gases is sequentially performed on a plurality of workpieces in a state in which the particles constituting the first gas adhere to the wall surface and the stage, a difference may occur between the result of etching of a film of the workpiece initially processed and the result of etching of a film of the workpiece finally processed. Therefore, there is a need to reduce a difference in etching result between films of workpieces processed sequentially after calibration of a flow rate controller.

SUMMARY

According to one embodiment of the present disclosure, there is provided a method of etching a film of a workpiece using a processing system, wherein the processing system includes a first processing apparatus and a second processing apparatus, the first processing apparatus being provided with a first chamber body including a first chamber provided therein, a stage located inside the first chamber, a gas supply part configured to supply a first gas and a second gas into the first chamber and including a flow rate controller configured to control a first flow rate of the first gas, an exhaust device configured to exhaust the first chamber, and a valve connected between the first chamber and the exhaust device, the first gas and the second gas reacting with the film to form a reaction product, the second processing apparatus being provided with a second chamber body including a second chamber provided therein, and a heater configured to heat the workpiece inside the second chamber, the method including: measuring a second flow rate of the first gas based on an increase rate of an internal pressure of the first chamber in a state in which the valve is closed and the first gas is supplied into the first chamber at the first flow rate adjusted by the flow rate controller, and calibrating the flow rate controller using the measured second flow rate; supplying the second gas into the first chamber; exhausting the first chamber; supplying a mixed gas of the first gas and the second gas into the first chamber in a state where the workpiece is not mounted on the stage; forming the reaction product from the film by supplying the mixed gas of the first gas and the second gas into the first chamber in a state where the workpiece is mounted on the stage; and removing the reaction product by heating the workpiece having the reaction product in a state where the workpiece having the reaction product is accommodated in the second chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
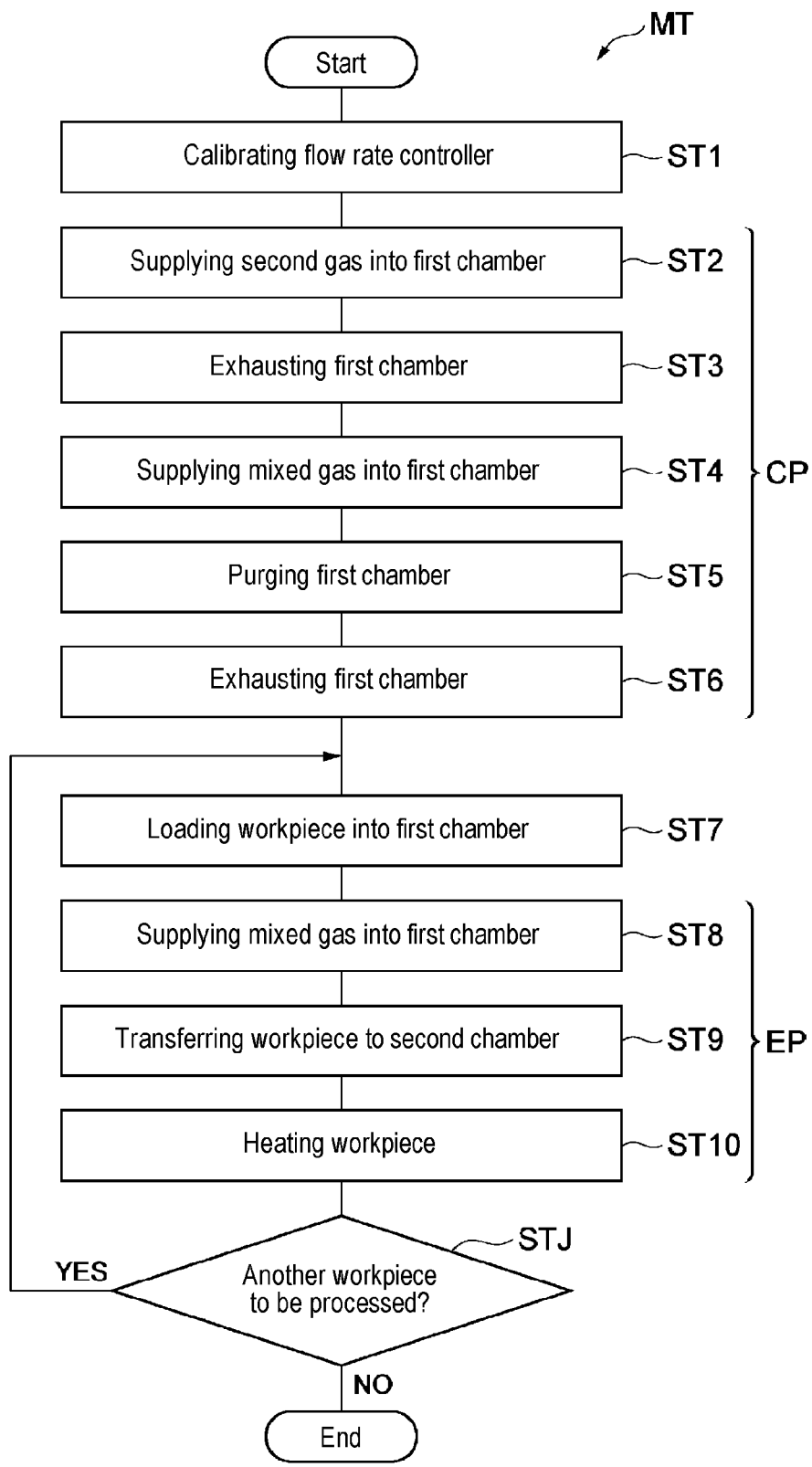
FIG. 1 is a flowchart diagram showing a film etching method according to one embodiment.

Reference will now be made in detail to various embodiments, examples of which are illustrated in the accompanying drawings. Throughout the drawings, the same or equivalent elements or parts are denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flowchart showing a film etching method according to one embodiment. The method shown in FIG. 1 uses a processing system to etch a film of a workpiece. A workpiece W (see FIG. 5A) has, for example, an underlayer UL and a film EF. The film EF is formed on the underlayer UL. The film EF may be a silicon-containing film. In one example, the film EF is a silicon oxide film. The silicon oxide film may be, but is not limited to, a natural oxide film formed when a portion thereof including the surface of a silicon layer is oxidized. In another example, the film EF may be a silicon film. The silicon film may be a polycrystalline silicon film, a single crystal silicon film, or an amorphous silicon film.

In the method MT, calibration of a flow controller for controlling a flow rate of a first gas in a mixed gas used to form a reaction product RP (see FIG. 5B) from the film EF is performed. Subsequently, a conditioning process of a first chamber supplied with the first gas is performed. Thereafter, etching of the film EF is performed. The processing system is used to implement this method MT.

Figure 2:
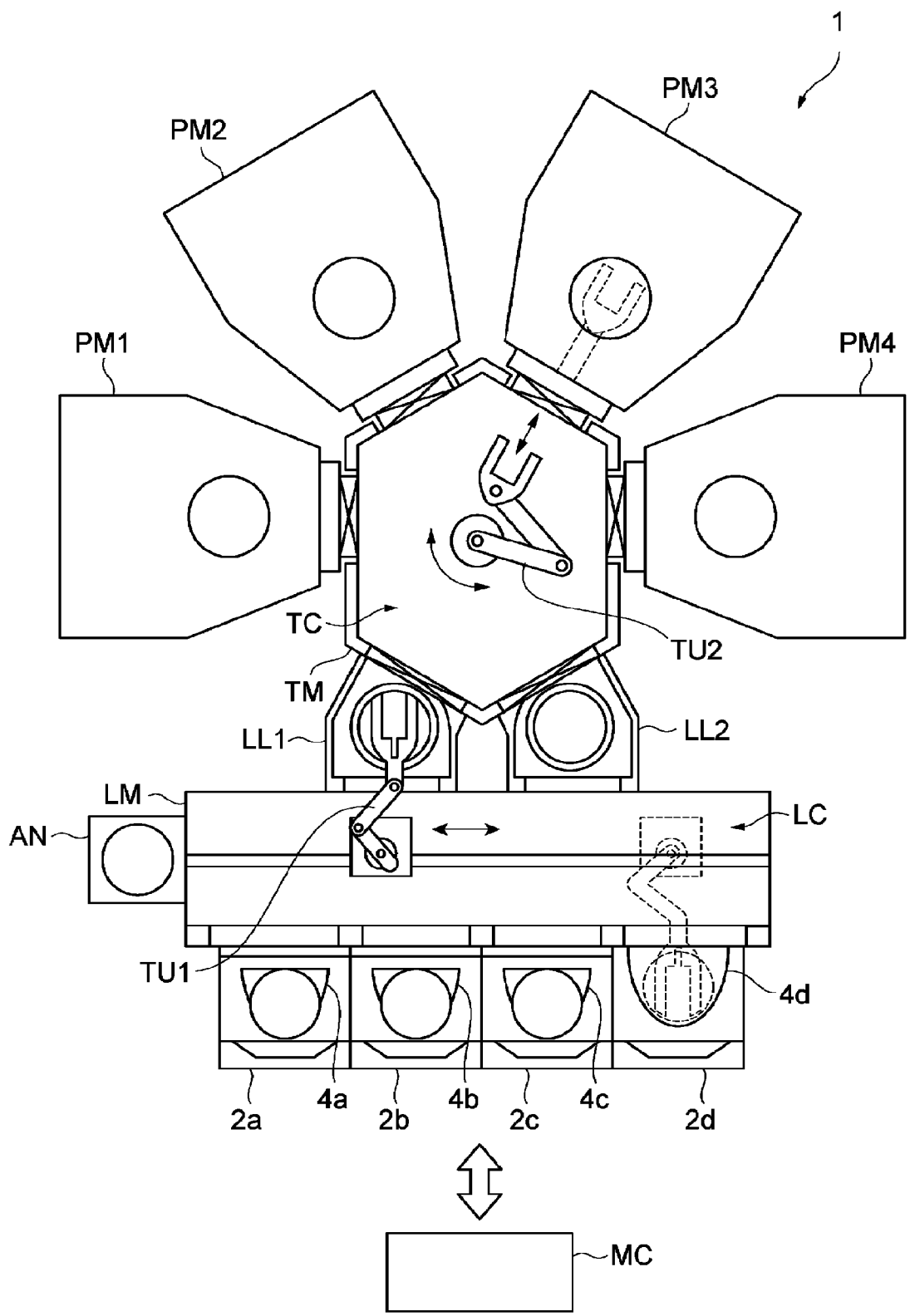
FIG. 2 is a view showing an example of a processing system which can be used for implementation of the method shown in FIG. 1.

FIG. 2 is a view showing an example of a processing system which can be used for the implementation of the method shown in FIG. 1. The processing system 1 shown in FIG. 2 includes tables 2a, 2b, 2c and 2d, containers 4a, 4b, 4c and 4d, a loader module LM, an aligner AN, load lock modules LL1 and LL2, a transfer module TM, process modules PM1, PM2, PM3 and PM 4. In addition, the number of tables of the processing system 1, the number of containers and the number of load lock modules may be an arbitrary number of one or more.

The tables 2a, 2b, 2c and 2d are arranged along one edge of the loader module LM. The containers 4a, 4b, 4c and 4d are mounted on the tables 2a, 2b, 2c and 2d, respectively. Each of the containers 4a, 4b, 4c and 4d is configured to accommodate the workpiece W therein. Each of the containers 4a, 4b, 4c and 4d may be a container such as a Front-Opening Unified Pod (FOUP).

The loader module LM includes a chamber LC provided therein. An internal pressure of the chamber LC is set to atmospheric pressure. The loader module LM includes a transfer device TU1. The transfer device TU1 is, for example, an articulated robot. The transfer device TU1 is configured to transfer the workpiece W via the chamber LC between each of the containers 4a, 4b, 4c and 4d and the aligner AN, between the aligner AN and each of the load lock modules LL1 and LL2 and between each of the containers 4a, 4b, 4c and 4d and each of the load lock modules LL1 and LL2. The aligner AN is connected to the loader module LM. The aligner AN calibrates a position of the workpiece W loaded thereinto.

The load lock modules LL1 and LL2 are interposed between the loader module LM and the transfer module TM. Each of the load lock modules LL1 and LL2 includes a preliminary depressurization chamber provided therein. A gate valve is interposed between the preliminary depressurization chamber of each of the load lock modules LL1 and LL2 and the chamber LC.

The transfer module TM includes a chamber TC provided therein. The chamber TC is configured to be able to be depressurized. A gate valve is interposed between the chamber TC and each of the load lock modules LL1 and LL2. The transfer module TM includes a transfer device TU2. The transfer device TU2 is, for example, an articulated robot. The transfer device TU2 is configured to transfer the workpiece W via the chamber TC between each of the load lock modules LL1 and LL2 and each of the process modules PM1, PM2, PM3 and PM4, and between any two process modules among the process modules PM1, PM2, PM3 and PM4.

Each of the process modules PM1, PM2, PM3 and PM4 is a device that executes dedicated substrate processing. A chamber of each of the process modules PM1, PM2, PM3 and PM4 is connected to the chamber TC via a respective gate valve. The number of process modules in the processing system 1 may be an arbitrary number of two or more. In one example, the process module PM1 is used as a first processing apparatus and the process module PM4 is used as a second processing apparatus.

The processing system 1 may further include a control part MC. The control part MC is configured to control each part of the processing system 1 in the course of executing the method MT. The control part MC may be a computer including a processor (for example a CPU), a storage device such as a memory, and an input/output interface for control signals. The storage device stores a control program and recipe data. As the processor operates according to the control program and the recipe data, a control signal is sent to each part of the processing system 1. The method MT can be executed according to such operation of the control part MC.

Figure 3:
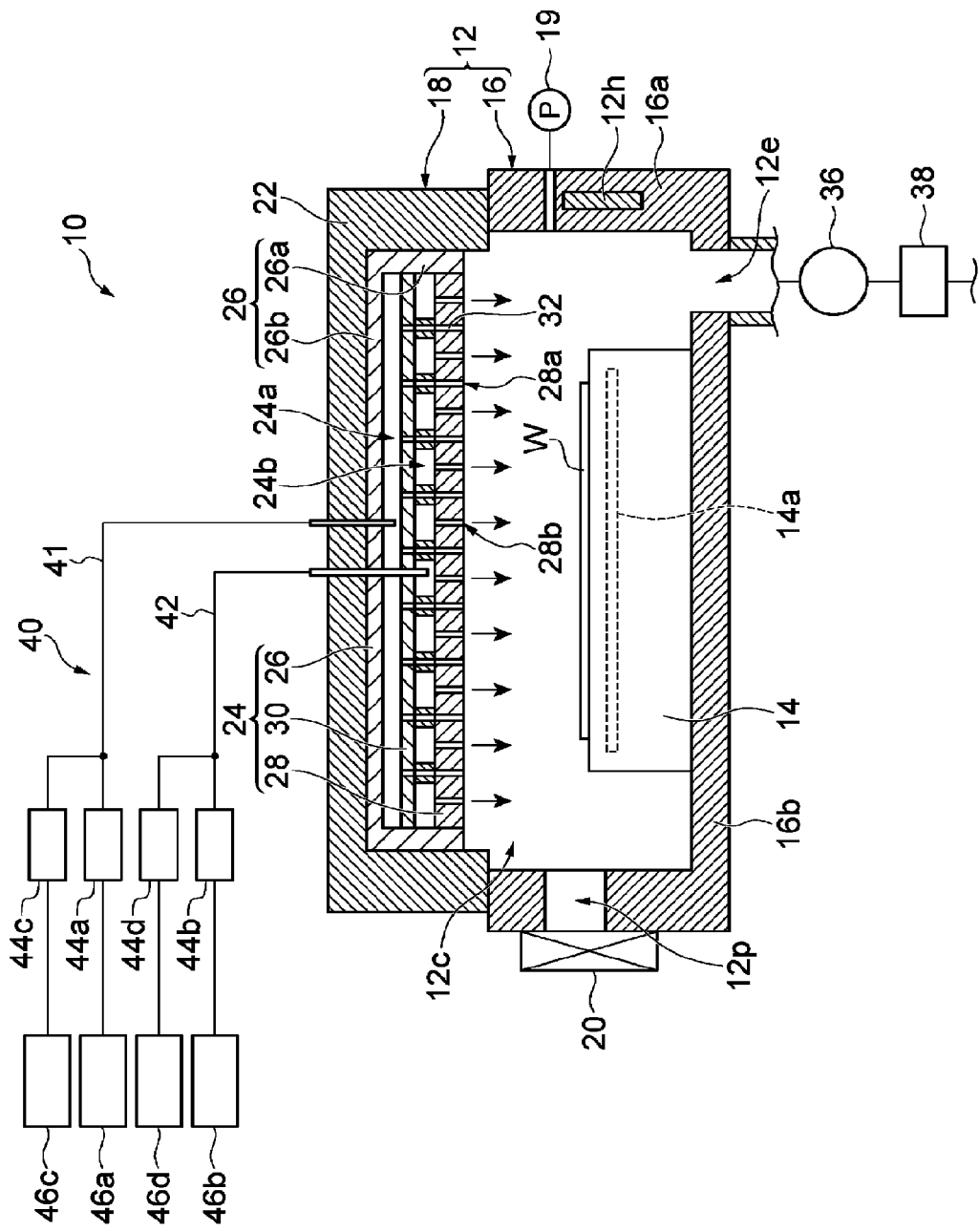
FIG. 3 is a view showing an example of a first processing apparatus which can be employed in the processing system shown in FIG. 2.

FIG. 3 is a view showing an example of the first processing apparatus which can be employed in the processing system 1 shown in FIG. 2. The first processing apparatus 10 shown in FIG. 3 includes a first chamber main body 12. An internal space of the first chamber main body 12 is used as a first chamber 12c.

A stage 14 is installed inside the first chamber 12c. The workpiece W is mounted on the stage 14 in a substantially horizontal posture. The stage 14 is configured to support the workpiece W mounted thereon. The stage 14 has a substantially circular shape in a plan view. The stage 14 is fixed to a bottom portion of the first chamber main body 12. The stage 14 includes a temperature adjustment mechanism 14a. In one example, the temperature adjustment mechanism 14a includes a flow path formed inside the stage 14. A heat exchange medium supply device is installed outside the first chamber main body 12. A heat exchange medium (for example, coolant) is supplied from the supply device to the internal flow path of the stage 14. The heat exchange medium supplied to the internal flow path of the stage 14 returns to the supply device. That is to say, the heat exchange medium circulates between the supply device and the internal flow path of the stage 14. A temperature of the stage 14 is adjusted as the heat exchange medium is supplied to the internal flow path of the stage 14.

The first processing apparatus 10 further includes a pressure sensor 19. The pressure sensor 19 is, for example, a capacitance manometer. The pressure sensor 19 is configured to measure an internal pressure of the first chamber 12c.

In one example, the first chamber main body 12 includes a first member 16 and a second member 18. The first member 16 extends laterally and downward in the first chamber 12c. The first member 16 includes a side wall portion 16a and a bottom portion 16b. The side wall portion 16a has a cylindrical shape. The bottom portion 16b continuously extends from a lower end of the side wall portion 16a. A passage 12p is formed in the side wall portion 16a.

Through the passage 12p, the workpiece W is loaded into the first chamber 12c from outside the first chamber main body 12 and is unloaded from the first chamber 12c outside the first chamber main body 12. A gate valve 20 is installed along the side wall portion 16a to open and close the passage 12p. When the gate valve 20 opens the passage 12p, the first chamber 12c and the chamber TC of the transfer module TM are in communication with each other. On the other hand, when the gate valve 20 closes the passage 12p, the first chamber 12c is disconnected from the chamber TC of the transfer module TM.

An upper end of the first member 16 is opened. The second member 18 is installed on the first member 16 so as to close the upper opening of the first member 16. A heater 12h is incorporated into the wall portion of the first chamber main body 12. The heater 12h is, for example, a resistive heater. The heater 12h heats the first chamber main body 12.

The second member 18 includes a lid 22 and a shower head 24. The lid 22 constitutes an outer portion of the second member 18. The shower head 24 is installed inside the lid 22. The shower head 24 is installed above the stage 14. The shower head 24 includes a main body 26 and a shower plate 28. The main body 26 includes a side wall 26a and an upper wall 26b. The side wall 26a has a cylindrical shape. The upper wall 26b continuously extends from an upper end of the side wall 26a so as to close the upper end of the side wall 26a.

The shower plate 28 is installed at a lower end side of the main body 26 inside the main body 26. A plate 30 is installed parallel to the shower plate 28 between the upper wall 26b of the main body 26 and the shower plate 28. A space between the main body 26 and the shower plate 28 includes a first space 24a and a second space 24b. The first space 24a is defined between the upper wall 26b of the main body 26 and the plate 30. The second space 24b is defined between the plate 30 and the shower plate 28.

The first processing apparatus 10 further includes a gas supply part 40. A first gas supply pipe 41 of the gas supply part 40 is connected to the first space 24a of the shower head 24. A plurality of gas passages 32 are connected to the first space 24a. The plurality of gas passages 32 extend from the plate 30 to the shower plate 28. The plurality of gas passages 32 are respectively connected to a plurality of first gas discharge holes 28a formed in the shower plate 28. A gas supplied from the first gas supply pipe 41 to the first space 24a is discharged into the first chamber 12c via the plurality of gas passages 32 and the plurality of first gas discharge holes 28a.

A second gas supply pipe 42 of the gas supply part 40 is connected to the second space 24b of the shower head 24. A plurality of second gas discharge holes 28b formed in the shower plate 28 are connected to the second space 24b. A gas supplied from the second gas supply pipe 42 to the second space 24b is discharged into the first chamber 12c via the plurality of second gas discharge holes 28b.

The gas supply part 40 is configured to supply a first gas and a second gas into the first chamber 12c. In one embodiment, the gas supply part 40 may be configured to supply an additional inert gas into the first chamber 12c. The gas supply part 40 includes a plurality of flow rate controllers 44a to 44d in addition to the first gas supply pipe 41 and the second gas supply pipe 42. Each of the plurality of flow rate controllers 44a to 44d is a mass flow controller or a pressure-controlled flow rate controller. Each of the flow rate controllers 44a to 44d adjusts a flow rate of gas supplied thereto to a set flow rate and outputs the gas whose flow rate is adjusted.

An input terminal of the flow rate controller 44a is connected to a gas source 46a which is a source of the first gas. An output terminal of the flow rate controller 44a is connected to the first gas supply pipe 41. When the film EF is a silicon oxide film, the first gas is a hydrogen fluoride (HF) gas. When the film EF is a silicon film, the first gas is a fluorine ($F_2$) gas.

An input terminal of the flow rate controller 44b is connected to a gas source 46b which is a source of the second gas. An output terminal of the flow rate controller 44b is connected to the second gas supply pipe 42. When the film EF is a silicon oxide film, the second gas is an ammonia ($NH_3$) gas or a gas composed of ethanol. When the film EF is a silicon film, the second gas is an ammonia ($NH_3$) gas.

An input terminal of the flow rate controller 44c is connected to a gas source 46c. An output terminal of the flow rate controller 44c is connected to the first gas supply pipe 41. An input terminal of the flow rate controller 44d is connected to a gas source 46d. An output terminal of the flow rate controller 44d is connected to the second gas supply pipe 42. Each of the gas source 46c and the gas source 46d is a source of the inert gas. The gas source 46c is a source of a noble gas such as an Ar gas, a He gas, a Ne gas, a Kr gas or the like. The gas source 46d is a source of a nitrogen ($N_2$) gas.

The first processing apparatus 10 further includes a valve 36 and an exhaust device 38. An exhaust port 12e is formed in the bottom portion 16b of the first chamber main body 12. The exhaust port 12e is in communication with the first chamber 12c. The exhaust device 38 is connected to the exhaust port 12e via the valve 36. The valve 36 is, for example, an automatic pressure control valve. The exhaust device 38 includes a vacuum pump such as a dry pump and a turbo molecular pump.

When a mixed gas of the first gas and the second gas is supplied into the first chamber 12c in the state where the workpiece W is accommodated in the first chamber 12c, the first gas and the second gas react with the film EF to form the reaction product RP (see FIG. 5B) from the film EF. The reaction product RP is removed in the second processing apparatus.

Figure 4:
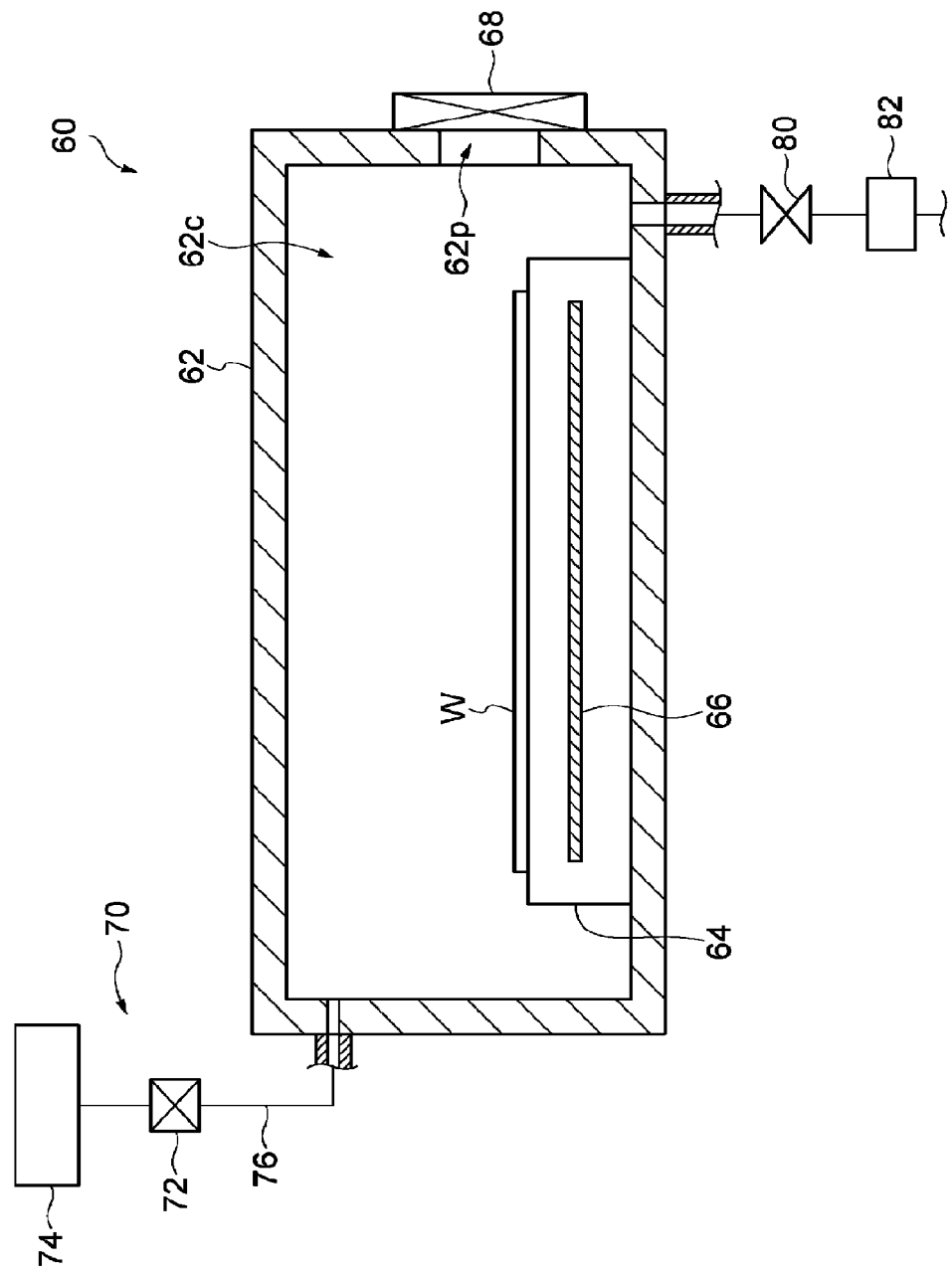
FIG. 4 is a view showing an example of a second processing apparatus which can be employed in the processing system shown in FIG. 2.

FIG. 4 is a view showing an example of the second processing apparatus which can be employed in the processing system shown in FIG. 2. The second processing apparatus 60 shown in FIG. 4 includes a second chamber main body 62. An inner space of the second chamber body 62 is used as a second chamber 62c. A stage 64 is installed inside the second chamber 62c. The stage 64 is configured to support the workpiece W mounted thereon. A heater 66 is incorporated in the stage 64. The heater 66 is, for example, a resistive heater.

A passage 62p is formed in a side wall of the second chamber body 62. Through the passage 62p, the workpiece W is loaded into the second chamber 62c from outside the second chamber body 62 and is unloaded from the second chamber 62c outward of the second chamber body 62. A gate valve 68 is installed along the side wall of the second chamber body 62 to open and close the passage 62p. When the gate valve 68 opens the passage 62p, the second chamber 62c and the chamber TC of the transfer module TM are in communication with each other. On the other hand, when the gate valve 68 closes the passage 62p, the second chamber 62c is disconnected from the chamber TC of the transfer module TM.

The second processing apparatus 60 further includes a gas supply part 70. The gas supply part 70 includes a flow rate controller 72. The flow rate controller 72 is a mass flow controller or a pressure-controlled flow rate controller. The flow rate controller 72 adjusts a flow rate of gas supplied thereto to a set flow rate and outputs the gas whose flow rate is adjusted. A gas source 74 is connected to an input terminal of the flow rate controller 72. The gas source 74 is a source of an inert gas, for example, a source of a nitrogen ($N_2$) gas. An output terminal of the flow rate controller 72 is connected to the second chamber 62c via a pipe 76. The second processing apparatus 60 further includes an opening/closing valve 80 and an exhaust device 82. The exhaust device 82 includes a vacuum pump such as a dry pump or a turbo molecular pump and is connected to the second chamber 62c via the opening/closing valve 80.

The workpiece W having the reaction product RP described above is transferred from the first chamber 12c to the second chamber 62c via the chamber TC. In the second chamber 62c, the workpiece W is mounted on the stage 64. Then, the stage 64 is heated by the heater 66 so that the workpiece W is heated. When the workpiece W is heated, the reaction product RP is sublimated and exhausted. As a result, the film EF is etched.

The method MT will be described in detail referring back to FIG. 1. In the following description, FIGS. 5A, 5B and 5C will be referred to which are views for explaining steps of the method shown in FIG. 1. In the following description, the method MT will be described taking as an example a case where the processing system 1 including the first processing apparatus 10 and the second processing apparatus 60 is used. In some embodiments, the method MT may be carried out using another processing system provided with another processing apparatus capable of supplying the mixed gas of the first gas and the second gas to a respective chamber and yet another processing apparatus capable of heating the workpiece having the reaction product formed thereon.

As shown in FIG. 1, the method MT starts at step ST1 in which the flow rate controller 44a is calibrated. In the course of executing step ST1, no object is mounted on the stage 14. The calibration of the flow rate controller 44a is based on a build-up method. Specifically, in step ST1, the first gas, the flow rate of which is adjusted by the flow rate controller 44a, is supplied into the first chamber 12c. In addition, the valve 36 is opened so that the first chamber 12c is depressurized by the exhaust device 38. When the internal pressure of the first chamber 12c is stabilized, the valve 36 is closed. After the valve 36 is closed, the rate of increase in the internal pressure of the first chamber 12c, namely the speed of increase in the internal pressure of the first chamber 12c, is obtained. The rate of increase in the internal pressure of the first chamber 12c may be obtained based on a pressure measured by the pressure sensor 19.

In step ST1, a measurement value of the flow rate of the first gas is acquired from the increase rate of the internal pressure of the first chamber 12c. The measurement value of the flow rate of the first gas is obtained by the following equation (1).

$$Q=(\Delta P/\Delta t)\times V\times C(=22.4/R)/T \text{ (temperature)} \qquad (1)$$

where, Q represents the measurement value of the flow rate of the first gas, $\Delta P/\Delta t$ represents the increase rate of the internal pressure of the first chamber 12c, V represents the known volume of the first chamber 12c, C is 22.4/R, R represents a gas constant, and T represents the temperature of the first chamber 12c. The temperature of the first chamber 12c may be measured by a temperature sensor.

In step ST1, the obtained measurement value of the flow rate of the first gas is used to calibrate the flow rate controller 44a. In the course of executing step ST1, particles constituting the first gas adhere onto the wall surface of the first chamber main body 12, the surface of the stage 14, and the like.

Subsequently, in the method MT, a conditioning process CP of the first processing apparatus 10 is executed. The conditioning process CP is executed in a state where no object is mounted on the stage 14. The conditioning process CP includes a series of steps ST2 to ST6.

In step ST2, the second gas is supplied from the gas supply part 40 into the first chamber 12c. During the execution of step ST2, the valve 36 is opened so that a gas existing in the first chamber 12c is exhausted by the exhaust device 38. In step ST2, particles formed by the reaction between the particles constituting the first gas and the particles constituting the second gas are exhausted. As a result, the amount of particles constituting the first gas that adheres onto the wall surface of the first chamber main body 12 and the surface of the stage 14 is reduced. In the subsequent step ST3, the first chamber 12c is exhausted by the exhaust device 38 in a state where no gas is supplied into the first chamber 12c.

In the subsequent step ST4, the mixed gas of the first gas and the second gas is supplied from the gas supply part 40 into the first chamber 12c. This mixed gas may contain an inert gas. The inert gas includes at least one of a nitrogen gas and a noble gas. During the execution of step ST4, the valve 36 is opened so that the first chamber 12c is depressurized by the exhaust device 38.

In one embodiment, the flow rate of the first gas in step ST4 is set to be equal to a flow rate of the first gas in step ST8 (to be described later), and the flow rate of the second gas is set to be equal to a flow rate of the second gas in step ST8. When the inert gas is supplied, a flow rate of the inert gas is also set to be equal to a flow rate of the inert gas used in step ST8. In one embodiment, the temperature of the first chamber main body 12 in step ST4 is set to be equal to the temperature of the first chamber main body 12 in step ST8 and the temperature of the stage 14 is set to be equal to the temperature of the stage 14 in step ST8. The temperature of the first chamber main body 12 is adjusted by the heater 12h. The temperature of the stage 14 is adjusted by the temperature adjustment mechanism 14a. In one embodiment, the internal pressure of the first chamber 12c in step ST4 is set to be equal to the internal pressure of the first chamber 12c in step ST8.

In the subsequent step ST5, the first chamber 12c is purged. In step ST5, inert gases, for example, a noble gas from the gas source 46c and a nitrogen gas from the gas source 46d, are supplied into the first chamber 12c. In step ST5, the valve 36 is opened so that the gas existing in the first chamber 12c is exhausted by the exhaust device 38. In the subsequent step ST6, the first chamber 12c is exhausted by the exhaust device 38 in a state where no gas is supplied into the first chamber 12c.

Figure 5A:
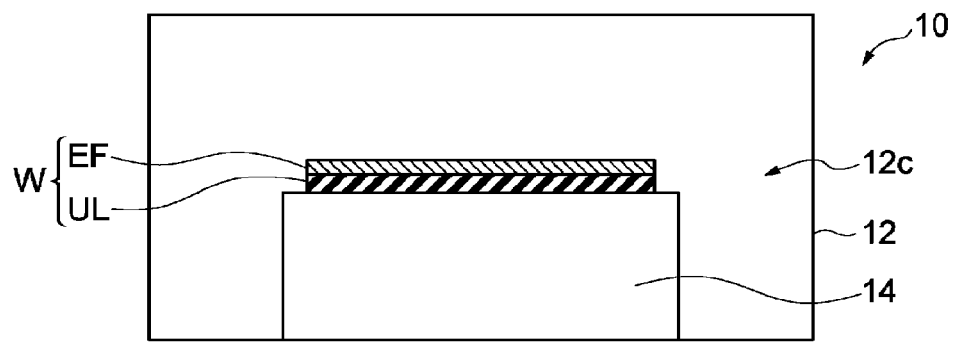
FIGS. 5A, 5B and 5C are views for explaining steps of the method shown in FIG. 1, respectively.

In the method MT, after the conditioning process CP is executed, an etching process EP for the film EF of the workpiece W is executed. Prior to the etching process EP, step ST7 is executed to load the workpiece W into the first chamber 12c. As shown in FIG. 5A, the workpiece W is mounted on the stage 14.

If the workpiece W is mounted on the stage 14, the etching process EP is executed. As shown in FIG. 1, the etching process EP includes a series of steps ST8 to ST10. In step ST8, the mixed gas of the first gas and the second gas is supplied from the gas supply part 40 into the first chamber 12c. This mixed gas may contain an inert gas. The inert gas includes at least one of a nitrogen gas and a noble gas. During the execution of step ST8, the valve 36 is opened so that the first chamber 12c is depressurized by the exhaust device 38. In one embodiment, in step ST8, the temperature of the first chamber main body 12 is set to a temperature higher than the temperature of the stage 14. For example, the temperature of the first chamber main body 12 is set to a temperature ranging from 60 to 100 degrees C., and the temperature of the stage 14 is set to a temperature ranging from 10 to 90 degrees C. The temperature of the first chamber main body 12 is adjusted by the heater 12h. The temperature of the stage 14 is adjusted by the temperature adjustment mechanism 14a.

Figure 5B:
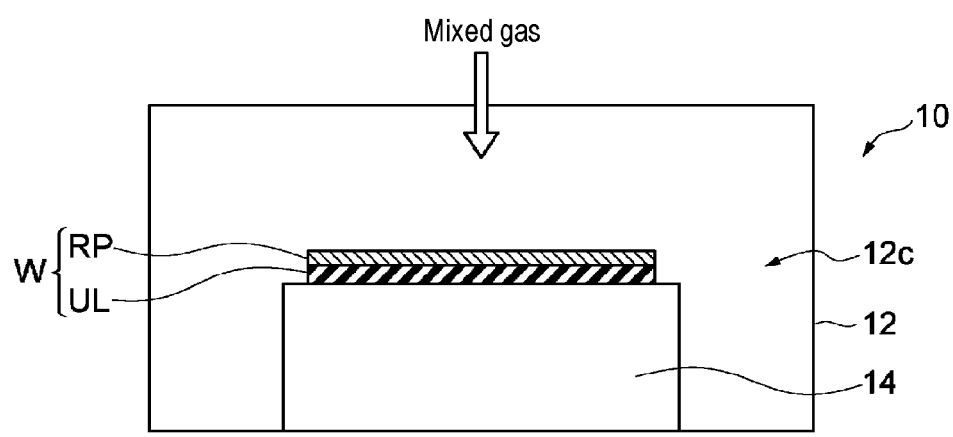

In step ST8, the first gas and the second gas contained in the mixed gas react with the film EF to form the reaction product RP from the film EF, as shown in FIG. 5B. In a case where the film EF is a silicon oxide film, the first gas is an HF gas and the second gas is an $NH_3$ gas, ammonium fluorosilicate is formed as a reaction product from the silicon oxide of the film EF. In a case where the film EF is a silicon oxide film, the first gas is an HF gas and the second gas is composed of ethanol, $SiF_4$, $SiO_2$, $Si(OH)_4$, $H_2SiO_3$ and the like are formed as reaction products from the silicon oxide of the film EF. Further, when the film EF is a silicon film, the first gas is an $F_2$ gas and the second gas is an $NH_3$ gas, $SiF_4$ is formed as a reaction product from silicon of the film EF.

In the subsequent step ST9, the workpiece W having the reaction product RP formed thereon is transferred from the first chamber 12c to the second chamber 62c via the chamber TC. That is to say, the workpiece W is transferred from the first chamber 12c to the second chamber 62c via only the depressurized space. In the second chamber 62c, the workpiece W is mounted on the stage 64.

Figure 5C:
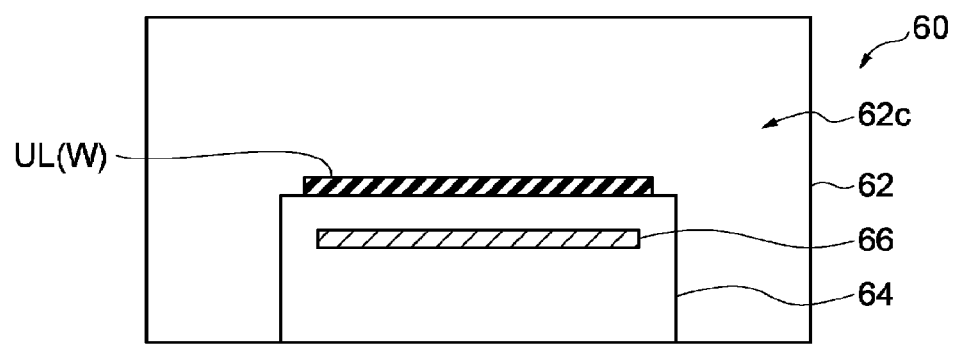

In the subsequent step ST10, the workpiece W is heated in the second chamber 62c. Specifically, the stage 64 is heated by the heater 66 and consequently, the workpiece W is heated. The temperatures of the stage 64 and the workpiece W are set to a temperature of, for example, 175 to 200 degrees C. During the execution of step ST10, an inert gas is supplied into the second chamber 62c and a gas existing in the second chamber 62c is exhausted. In step ST10, the reaction product RP is sublimated and exhausted. As a result, as shown in FIG. 5C, the film EF is etched.

Subsequently, in the method MT, it is determined whether or not to process another workpiece W. When another workpiece W needs to be processed, the series of steps ST7 to ST10 are repeated with respect to the respective workpiece W. On the other hand, when another workpiece W does not need to be processed, the method MT is ended.

In the method MT, after the flow rate controller 44a for the first gas is calibrated in step ST1, the second gas is supplied into the first chamber 12c. Thus, the amount of particles constituting the first gas that adheres onto the wall surface of the first chamber main body 12 and the surface of the stage 14 is reduced. Thereafter, the mixed gas of the first gas and the second gas is supplied into the first chamber 12c so that the state of the wall surface of the first chamber main body 12 and the surface of the stage 14 is changed into the stationary state at the time of execution of the process (step ST8) of forming a reaction product from a film. As a result, even if a plurality of workpieces W is sequentially processed by the etching process EP including step ST8 and step ST10, a difference in etching results of the films EF in the plurality of workpieces W is reduced.

Hereinafter, an evaluation experiment conducted on the method MT will be described. In the evaluation experiment, steps ST1 to ST6 were executed and then etching process including steps ST8 to ST10 was sequentially executed for five samples having a silicon oxide film. Then, the etching amounts of silicon oxide films in the five samples, namely the reduction amounts of film thickness of the silicon oxide films, were obtained. Various conditions applied in the evaluation experiment are shown below. In this evaluation experiment, an HF gas was used as the first gas, an $NH_3$ gas was used as the second gas, and an Ar gas and an $N_2$ gas were used as the inert gas.

<Various Conditions of Evaluation Experiment>
Step ST2
    Flow rate of $NH_3$ gas: 20 sccm
    Internal pressure of first chamber 12c: 25 Pa
    Temperature of first chamber main body 12: 60 degrees C.
    Temperature of stage 14: 31.5 degrees C.
    Execution time: 10 seconds
Step ST3
    Execution time: 5 seconds
Step ST4
    Flow rate of HF gas: 20 sccm
    Flow rate of $NH_3$ gas: 20 sccm
    Flow rate of Ar gas: 150 sccm
    Flow rate of $N_2$ gas: 125 sccm
    Internal pressure of first chamber 12c: 13.3 Pa
    Temperature of first chamber main body 12: 60 degrees C.
    Temperature of stage 14: 31.5 degrees C.
    Execution time: 100 seconds
Step ST5
    Flow rate of Ar gas: 200 sccm
    Flow rate of $NH_3$ gas: 20 sccm
    Internal pressure of first chamber 12c by vacuum purge: 1 Pa
    Temperature of first chamber main body 12: 60 degrees C.
    Temperature of stage 14: 31.5 degrees C.
    Execution time: 5 seconds
Step ST6
    Execution time: 5 seconds
Step ST8
    Flow rate of HF gas: 20 sccm
    Flow rate of $NH_3$ gas: 20 sccm
    Flow rate of Ar gas: 150 sccm
    Flow rate of $N_2$ gas: 125 sccm
    Pressure of first chamber 12c: 13.3 Pa
    Temperature of first chamber main body 12: 60 degrees C.
    Temperature of stage 14: 31.5 degrees C.
    Execution time: 22 seconds
Step ST9
    Flow rate of $N_2$ gas: 800 sccm
    Internal pressure of second chamber 62c: 133.3 Pa
    Temperature of stage 64: 170 degrees C.
    Execution time: 55 seconds For comparison, first to third comparative experiments were conducted. In the first comparative experiment, without calibration of the flow rate controller 44a, an inert gas was supplied into the first chamber 12c in a first step, a mixed gas was supplied into the first chamber 12c in a second step, the first chamber 12c was purged in a third step, and the first chamber 12c was exhausted in a fourth step. Thereafter, the etching process including steps ST8 to ST10 was sequentially executed for five samples having a silicon oxide film under the same conditions as those in steps ST8 to ST10 of the above-described evaluation experiment. Then, the etching amounts of silicon oxide films of the five samples were obtained. Various conditions applied in the first comparative experiment are shown below.

<Various Conditions of First Comparative Experiment>
First Step
    Flow rate of Ar gas: 270 sccm
    Flow rate of $N_2$ gas: 100 sccm
    Internal pressure of first chamber 12c by vacuum purge: 1.5 Pa
    Temperature of first chamber main body 12: 60 degrees C.
    Temperature of stage 14: 31.5 degrees C.
    Execution time: 90 seconds
Second Step
    Flow rate of HF gas: 20 sccm
    Flow rate of $NH_3$ gas: 20 sccm
    Flow rate of Ar gas: 250 sccm
    Internal pressure of first chamber 12c: 30 Pa
    Temperature of first chamber main body 12: 60 degrees C.
    Temperature of stage 14: 31.5 degrees C.
    Execution time: 100 seconds
Third Step
    Flow rate of Ar gas: 200 sccm
    Flow rate of $NH_3$ gas: 20 sccm
    Internal pressure of first chamber 12c: 3.5 Pa
    Temperature of first chamber main body 12: 60 degrees C.
    Temperature of stage 14: 31.5 degrees C.
    Execution time: 10 seconds
Fourth Step
    Execution time: 10 seconds In the second comparative experiment, the flow rate controller 44a was calibrated in the same manner as in step ST1 of the above-described evaluation experiment. Subsequently, the etching process including steps ST8 to ST10 was sequentially executed for five samples having a silicon oxide film under the same conditions as those in steps ST8 to ST10 of the above-described evaluation experiment. Then, the etching amounts of silicon oxide films of the five samples were obtained.

In the third comparative experiment, the flow rate controller 44a was calibrated in the same manner as in step ST1 of the above-described evaluation experiment, and four steps having the same conditions as those in the first to fourth steps of the first comparative experiment were sequentially executed. Thereafter, the etching process including steps ST8 to ST10 was sequentially executed for five samples having a silicon oxide film under the same conditions as those in steps ST8 to ST10 of the above-described evaluation experiment. Then, the etching amounts of silicon oxide films of the five samples were obtained.

Figure 6:
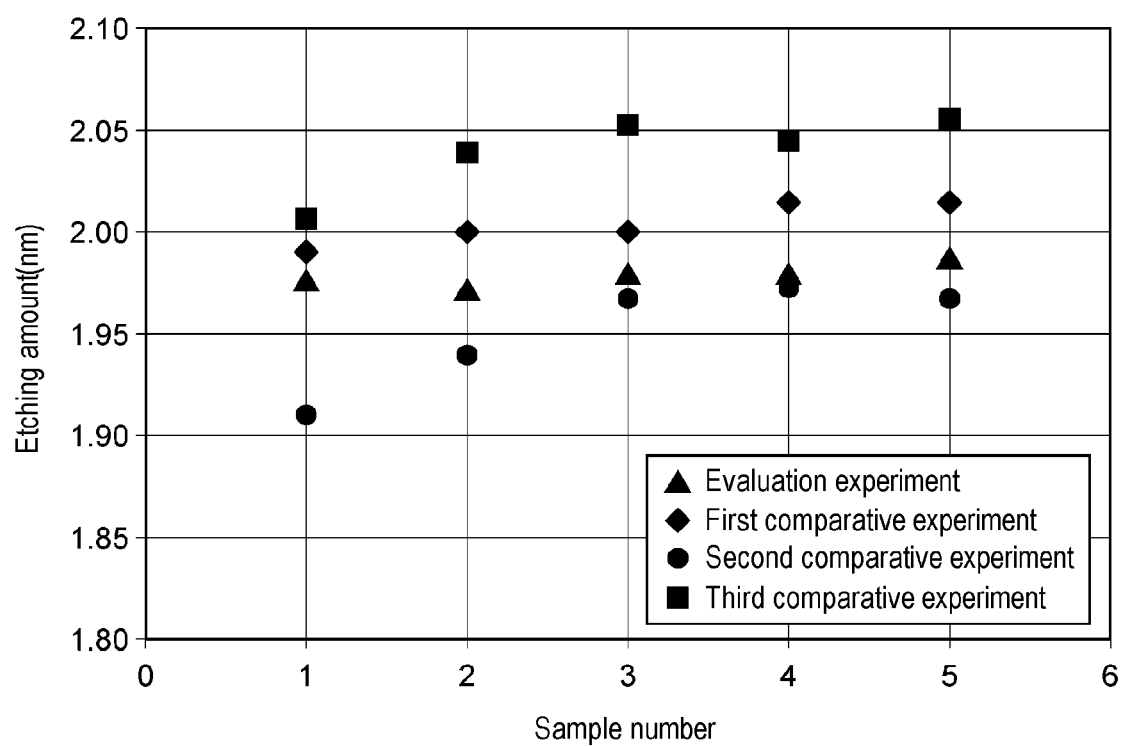
FIG. 6 is a graph showing experimental results.

FIG. 6 is a graph showing the results of the above experiments. In the graph of FIG. 6, the horizontal axis represents a sample number. That is to say, in the graph of FIG. 6, the horizontal axis represents the numbers of samples sequentially processed in the evaluation experiment and the first to third comparative experiments. The number of the sample initially processed is "1" and the number of the sample finally processed is "5". The vertical axis represents the etching amount. In the first comparative experiment, since the conditioning process including the above-described first to fourth steps was performed without calibrating the flow rate controller 44a, the difference in etching amount between the five samples was relatively small as shown in FIG. 6. In the second comparative experiment, since the conditioning process was not performed after calibrating the flow rate controller 44a, the etching amount was increased with the increase of the sample number and was stabilized after the execution of steps ST8 to ST10 for several samples. That is to say, in the second comparative experiment, the difference in etching amount between the five samples was relatively large. In the third comparative experiment, although the conditioning process including the above-described first to fourth steps was performed after calibrating the flow rate controller 44a, the etching amount was increased with the increase of the sample number and was stabilized after the execution of steps ST8 to ST10 for several samples. That is to say, in the third comparative experiment, the difference in etching amount between the five samples was relatively large. On the other hand, in the evaluation experiment, the difference in etching amount between the five samples was considerably small. This shows that the method MT is effective.

According to the present disclosure in some embodiments, it is possible to reduce a difference in etching result between films of workpieces which are sequentially processed after calibrating a flow rate controller.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of etching a film of a workpiece using a processing system,
    wherein the processing system includes a first processing apparatus and a second processing apparatus,
    the first processing apparatus being provided with a first chamber body including a first chamber provided therein, a stage located inside the first chamber, a gas supply part configured to supply a first gas and a second gas into the first chamber and including a flow rate controller configured to control a first flow rate of the first gas, an exhaust device configured to exhaust the first chamber, and a valve connected between the first chamber and the exhaust device, the first gas and the second gas reacting with the film to form a reaction product,
    the second processing apparatus being provided with a second chamber body including a second chamber provided therein, and a heater configured to heat the workpiece inside the second chamber,
    the method comprising:
    measuring a second flow rate of the first gas based on an increase rate of an internal pressure of the first chamber in a state in which the valve is closed and the first gas is supplied into the first chamber at the first flow rate adjusted by the flow rate controller, and configuring the flow rate controller using the measured second flow rate to provide the first gas at the first flow rate;
    supplying the second gas into the first chamber in a state where the workpiece is not mounted on the stage;
    exhausting the first chamber in the state where the workpiece is not mounted on the stage;
    supplying a mixed gas of the first gas and the second gas into the first chamber in the state where the workpiece is not mounted on the stage;
    forming the reaction product from the film by supplying the mixed gas of the first gas and the second gas into the first chamber in a state where the workpiece is mounted on the stage; and removing the reaction product by heating the workpiece having the reaction product in a state where the workpiece having the reaction product is accommodated in the second chamber.

2. The method of claim 1, wherein the film is a silicon oxide film, the first gas is an HF gas, and the second gas is an $NH_3$ gas.

3. The method of claim 1, wherein the film is a silicon oxide film, the first gas is an HF gas, and the second gas contains ethanol.

4. The method of claim 1, wherein the film is a silicon film, the first gas is an $F_2$ gas, and the second gas is an $NH_3$ gas.

5. The method of claim 1, wherein the gas supply part is further configured to supply an inert gas into the first chamber, wherein the supplying the second gas into the first chamber further includes supplying the inert gas into the first chamber.

6. The method of claim 5, wherein the inert gas includes at least one of a nitrogen gas and a noble gas.

7. The method of claim 1, wherein the forming the reaction product includes setting a first temperature of the first chamber body to be higher than a first temperature of the stage, and wherein the supplying the second gas into the first chamber includes:

setting a second temperature of the stage to be equal to the first temperature of the stage set in the forming the reaction product; and setting a second temperature of the first chamber body to be equal to the first temperature of the first chamber body set in the forming the reaction product.

* * * * *